(12) United States Patent
Hou et al.

(10) Patent No.: US 7,501,161 B2
(45) Date of Patent: Mar. 10, 2009

(54) METHODS AND APPARATUS FOR REDUCING ARCING DURING PLASMA PROCESSING

(75) Inventors: Li Hou, Cupertino, CA (US); Qunhua Wang, San Jose, CA (US); Edwin Sum, Danville, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/858,267

(22) Filed: Jun. 1, 2004

(65) Prior Publication Data

US 2005/0266174 A1    Dec. 1, 2005

(51) Int. Cl.
*H05H 1/24* (2006.01)
*C23C 16/50* (2006.01)

(52) U.S. Cl. .................. 427/569; 427/562; 118/728; 216/67; 204/192.12; 204/298.01; 204/298.15

(58) Field of Classification Search .............. None
See application file for complete search history.

(56) References Cited

U.S. PATENT DOCUMENTS

| | | | | |
|---|---|---|---|---|
| 4,194,930 A | * | 3/1980 | Tanaka et al. | 148/222 |
| 5,093,151 A | * | 3/1992 | van den Berg et al. | 427/569 |
| 5,567,289 A | * | 10/1996 | Taylor et al. | 204/298.11 |
| 5,573,596 A | * | 11/1996 | Yin | 118/723 E |
| 5,611,865 A | * | 3/1997 | White et al. | 118/725 |
| 5,720,818 A | * | 2/1998 | Donde et al. | 118/500 |
| 5,895,549 A | * | 4/1999 | Goto et al. | 156/345.51 |
| 5,942,042 A | * | 8/1999 | Gogh | 118/728 |
| 6,074,488 A | * | 6/2000 | Roderick et al. | 118/728 |
| 6,270,859 B2 | * | 8/2001 | Zhao et al. | 427/535 |
| 6,355,108 B1 | * | 3/2002 | Won et al. | 118/728 |
| 6,365,495 B2 | * | 4/2002 | Wang et al. | 438/582 |
| 6,406,925 B1 | * | 6/2002 | Athavale et al. | 438/14 |
| 6,494,958 B1 | * | 12/2002 | Shamouilian et al. | 118/728 |
| 6,499,427 B1 | * | 12/2002 | Yamazaki et al. | 118/723 E |
| 6,528,751 B1 | * | 3/2003 | Hoffman et al. | 219/121.43 |
| 6,554,954 B2 | * | 4/2003 | Ma et al. | 156/345.51 |
| 6,960,263 B2 | * | 11/2005 | Tanaka et al. | 118/720 |
| 2003/0106646 A1 | * | 6/2003 | Ma et al. | 156/345.51 |
| 2003/0205327 A1 | * | 11/2003 | Howald et al. | 156/345.28 |
| 2005/0120960 A1 | * | 6/2005 | Chen | 118/728 |

FOREIGN PATENT DOCUMENTS

| KR | 2001-0012878 | 2/2001 |
|---|---|---|
| WO | WO 98/53482 A1 | 11/1998 |

* cited by examiner

*Primary Examiner*—Marianne L Padgett
(74) *Attorney, Agent, or Firm*—Dugan & Dugan PC

(57) ABSTRACT

In a first aspect, a method is provided for use during plasma processing. The first method includes the steps of (1) placing a substrate on a substrate holder of a plasma chamber; (2) positioning a cover frame adjacent and below a perimeter of the substrate; and (3) employing the cover frame to reduce arcing during plasma processing within the plasma chamber. Numerous other aspects are provided.

7 Claims, 6 Drawing Sheets

US 7,501,161 B2

METHODS AND APPARATUS FOR REDUCING ARCING DURING PLASMA PROCESSING

FIELD OF THE INVENTION

The present invention relates generally to flat panel display and/or semiconductor device manufacturing, and more particularly to methods and apparatus for reducing arcing during plasma processing.

BACKGROUND

FIG. 1 illustrates a conventional apparatus 101 that may be employed during plasma processing. With reference to FIG. 1, the conventional apparatus 101 includes a substrate holder 103, such as a susceptor, for supporting a substrate 105 (e.g., a glass substrate, a polymer substrate, a semiconductor wafer, etc.). The substrate holder 103 may be employed, for example, as a first electrode. The conventional apparatus 101 includes a shadow frame 107 for preventing arcing (e.g., between the substrate holder 103 and a second electrode (not shown)) during plasma processing. A portion 109 (e.g., a lip) of the shadow frame 107 of the conventional apparatus 101 overlies (e.g., contacts) an edge region of the substrate 105 and reduces arcing during plasma processing (as is known in the art), such as thin film deposition. The lip 109 of the shadow frame 107 also prevents film deposition on an outer edge region 111 of the substrate 105, which is referred to as a film edge exclusion area. While the conventional shadow frame 107 reduces arcing during plasma processing, the shadow frame 107 also disturbs process parameters (e.g., gas flow, electrical field, etc.) in a processing chamber (not shown) which includes the conventional apparatus 101. Consequently, a film deposited on the substrate 105 (e.g., proximate the lip 109 of the shadow frame 107) may not be of a uniform thickness. Improved methods and apparatus for reducing arcing during plasma processing are desirable.

SUMMARY OF THE INVENTION

In a first aspect of the invention, a first method is provided for use during plasma processing. The first method includes the steps of (1) placing a substrate on a substrate holder of a plasma chamber; (2) positioning a cover frame adjacent and below a perimeter of the substrate; and (3) employing the cover frame to reduce arcing during plasma processing within the plasma chamber.

In a second aspect of the invention, a second method is provided for use during plasma processing. The second method includes the steps of (1) placing a substrate on a substrate holder of a plasma chamber; (2) positioning a cover frame adjacent and below a perimeter of the substrate; (3) positioning a shadow frame adjacent a perimeter of the substrate such that the shadow frame does not contact or overlie the substrate; and (4) employing the cover frame and shadow frame to reduce arcing during plasma processing within the plasma chamber.

In a third aspect of the invention, a third method is provided for use during plasma processing. The third method includes the steps of (1) placing a substrate on a substrate holder of a plasma chamber; (2) positioning a shadow frame adjacent a perimeter of the substrate such that the shadow frame does not contact or overlie the substrate; and (3) employing the shadow frame to reduce arcing during plasma processing within the plasma chamber. Numerous other aspects are provided, as are systems and apparatus in accordance with these and other aspects of the invention.

Other features and aspects of the present invention will become more fully apparent from the following detailed description, the appended claims and the accompanying drawings.

DETAILED DESCRIPTION

Aspects of the present invention may increase the uniformity of film deposited on a substrate (e.g., proximate an edge region of the substrate) during plasma processing, such as plasma enhanced chemical vapor deposition (PECVD). Further, a portion of the substrate upon which no film is deposited, such as a film edge exclusion area, is minimized or eliminated.

Figure 2A:
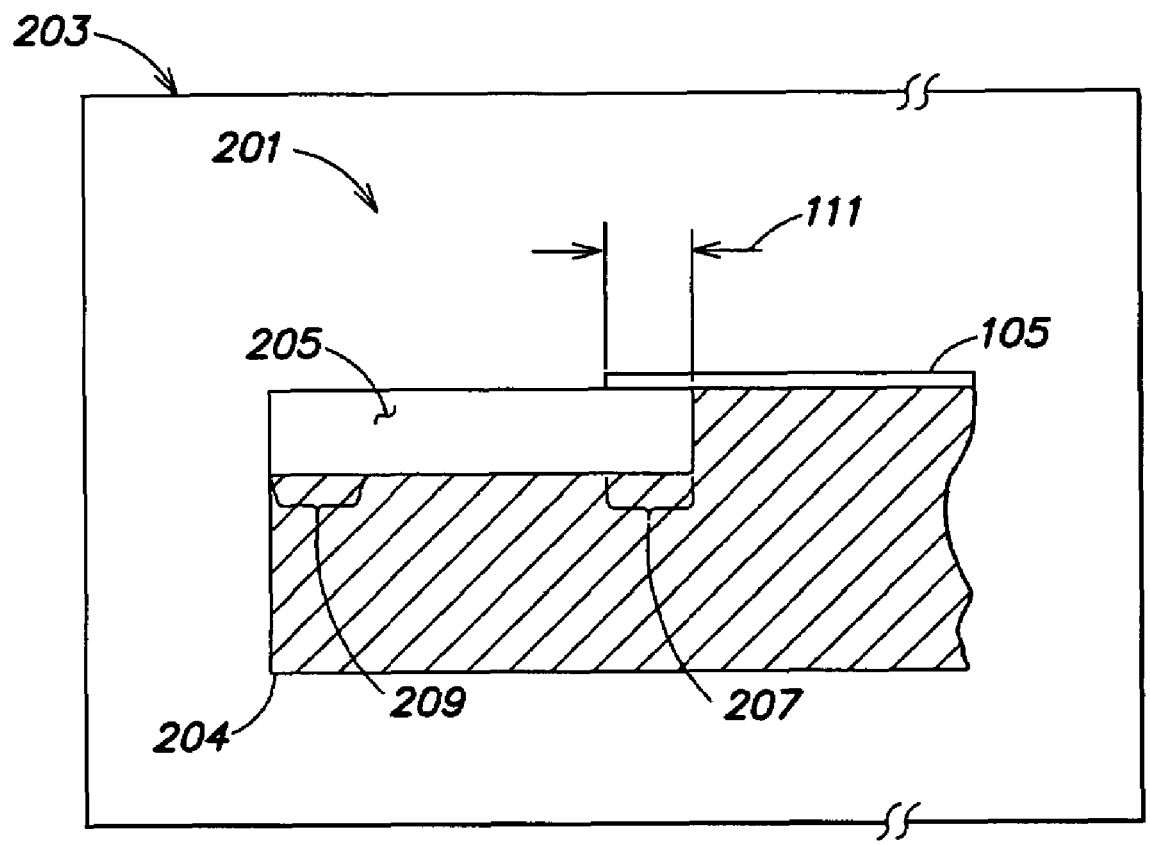
FIG. 2A illustrates a first exemplary apparatus that may be employed during plasma processing in accordance with an embodiment of the present invention.

FIG. 2A illustrates a first exemplary apparatus 201 that may be employed during plasma processing in accordance with an embodiment of the present invention. With reference to FIG. 2A, the first exemplary apparatus 201 may be included in a plasma chamber 203. The first exemplary apparatus 201 includes a substrate holder 204, such as a susceptor, adapted to support a substrate 105 (e.g., a glass substrate, a semiconductor substrate, etc.). The substrate holder 204 may serve as a first electrode (e.g., grounded or powered) during plasma processing. As such, the substrate holder 204 may be susceptible to arcing.

The first exemplary apparatus 201 includes a cover frame 205 adapted to reduce arcing during plasma processing within the plasma chamber 203. For example, the cover frame 205 may be formed from aluminum, ceramic or another material that may be maintained at a neutral or floating potential during plasma processing within the plasma chamber 203. More specifically, the cover frame 205 may be placed upon a surface of the substrate holder 204 such that the cover frame 205 contacts or adjoins one or more surfaces of the substrate holder 204, thereby preventing portions of the one or more surfaces of the substrate support 204 from contacting a plasma introduced in the plasma chamber 203 during plasma processing.

As shown in FIG. 2A, the cover frame 205 may be positioned adjacent and below the perimeter of the substrate 105. For example, a first end 207 of the cover frame 205 may underlie the substrate 105. In this manner, the cover frame 205 ensures that portions of one or more surfaces of the substrate holder 204 do not contact the plasma during plasma processing. In one embodiment, at least a 5 mm (preferably a 5-10 mm) portion of the cover frame 205 underlies an edge region 111 of the substrate 105 (e.g., such that the substrate 105 does not need to be perfectly positioned onto the substrate holder 204). A larger or smaller portion of the cover frame 205 may underlie the substrate 105.

A second end 209 of the cover frame 205 preferably extends at least to the perimeter of the substrate holder 204. Such an arrangement has been found to increase the uniformity of a film deposited on the substrate 105 (e.g., film deposition uniformity) during plasma processing. For example, use of the cover frame 205 has been found to increase the film deposition uniformity proximate and/or along an edge region 111 of the substrate 105. The use of the cover frame 205 may also minimize or eliminate a portion of the substrate 105, such as the edge region 111, upon which no film is deposited during plasma processing (e.g., an edge exclusion area).

When the cover frame 205 is employed, the value of at least one process parameter, such as pressure, electrode spacing, RF power and gas flow, within the plasma chamber 203 may be adjusted or tuned from values of the process parameters used during plasma processing in a plasma chamber which includes the convention apparatus 101. In at least one embodiment, a pressure of 1-3 Torrs (e.g., of Silane, Hydrogen, Nitrogen, Ammonia, etc.), an electrode spacing of about 1000 mils, an RF power of a few kilowatts, and/or a gas flow of about 1000 sccm may be employed. Other values may be employed for the pressure, electrode spacing, RF power and/or gas flow.

Because the cover frame 205 does not overlie the substrate 105, the cover frame 205 does not significantly disturb process parameters during plasma processing. Therefore, the uniformity of a film deposited on the substrate 105 (e.g., proximate and/or along an edge region 111 of the substrate 105) is increased compared to the uniformity of a film deposited on a substrate using the conventional apparatus 101. As stated, the cover frame 205 also allows a film to be deposited on all or most of the substrate 105.

Figure 2B:
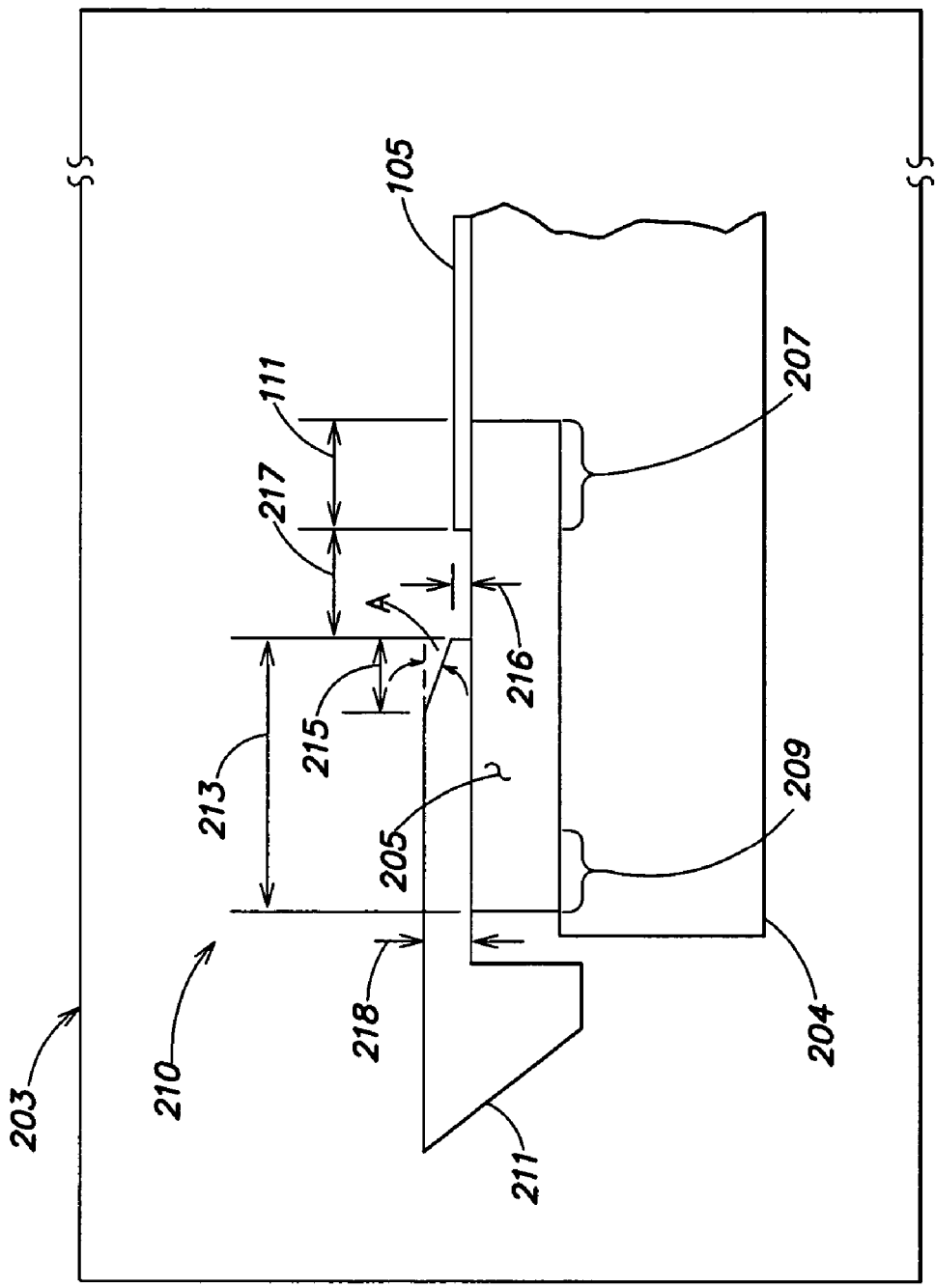
FIG. 2B illustrates a second exemplary apparatus that may be employed during plasma processing in accordance with an embodiment of the present invention.

FIG. 2B illustrates a second exemplary apparatus that may be employed during plasma processing in accordance with an embodiment of the present invention. With reference to FIG. 2B, the second exemplary apparatus 210 is similar to the first exemplary apparatus 201. However, a second end 209 of the cover frame 205 of the second exemplary apparatus 210 may not extend to the perimeter of the substrate holder 204. Therefore, portions of the substrate holder 204 (e.g., proximate the perimeter of the substrate holder 204) are not covered by the cover frame 205 and may be susceptible to arcing. The second exemplary apparatus 210 includes a shadow frame 211 adapted to reduce arcing during plasma processing within the plasma chamber 203. The shadow frame 211 is placed upon a surface of the cover frame 205 such that the shadow frame 211 overlies one or more surfaces of the substrate holder 204 (e.g., the portions of the substrate holder 204 not covered by the cover frame 205). For example, in FIG. 2B a portion 213 of the shadow frame 211 overlies the cover frame 205 (e.g., at least a 5 mm (preferably a 5-10 mm) portion of the shadow frame 211 overlies the cover frame 205 in one embodiment, although other values may be used). In this manner, similar to the cover frame 205, the shadow frame 211 ensures that portions of one or more surfaces of the substrate holder 204 do not contact the plasma during plasma processing.

The shadow frame 211 may be formed from anodized aluminum, ceramic, or the like. The shadow frame 211 is preferably at a neutral or floating potential to reduce arcing.

Figure 1:
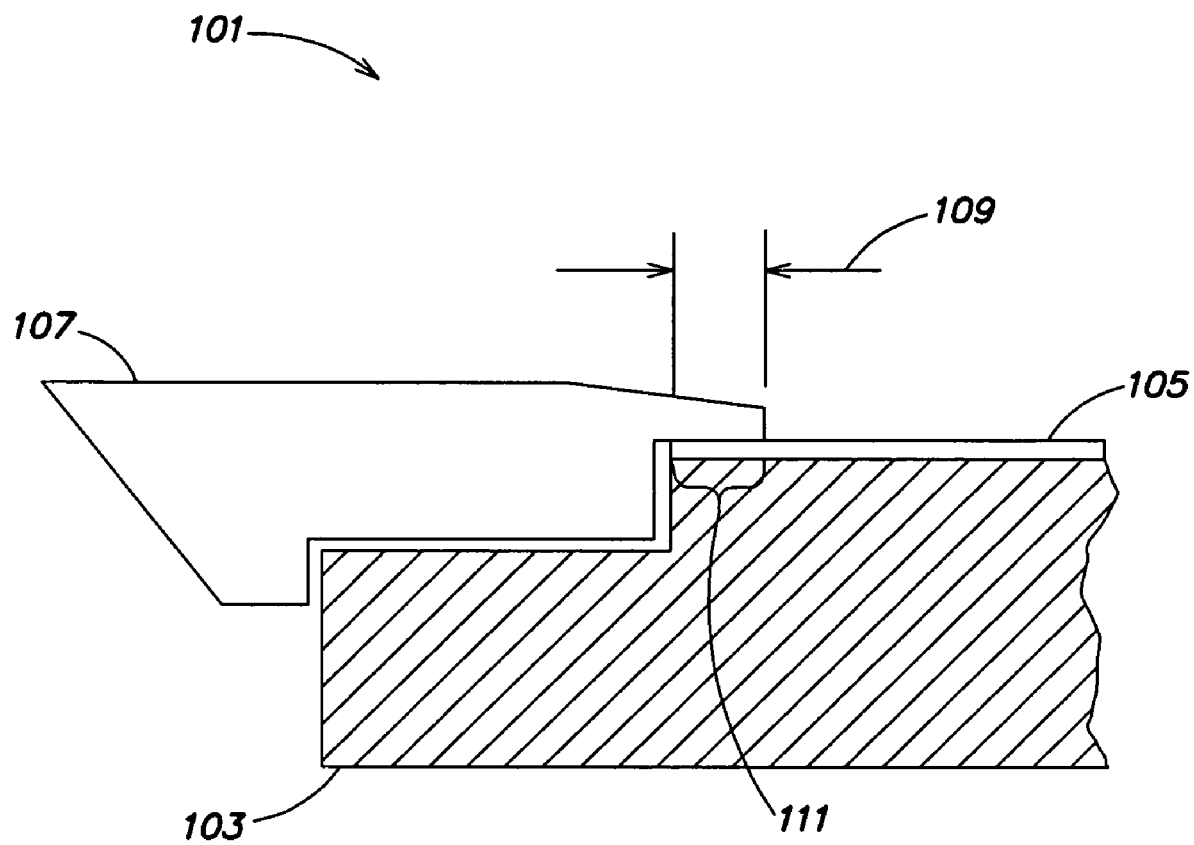
FIG. 1 illustrates a conventional apparatus that may be employed during plasma processing.

In the embodiment shown, a lip 215 of the shadow frame 211 may be thicker and/or stronger than the lip 109 (FIG. 1) of the shadow frame 107 of the conventional apparatus 101 so as not to deform during shaping as indicated by reference numeral 216. A remaining portion of the shadow frame 211 that overlies the support holder 204 may be thinner (as indicated by reference numeral 218) than a corresponding remaining portion of the conventional shadow frame 107 that overlies the substrate support 103, for example, to accommodate the cover frame 205. In at least one embodiment, the lip 215 of the shadow frame 211 may include a bevel of an angle A of about 45° (as described further below). The bevel may be of different angles and/or shapes. Such a bevel may regulate the flow of and guide one or more gases over the substrate 105 during plasma processing.

As shown in FIG. 2B, the shadow frame 211 is positioned adjacent a perimeter of the substrate 105 such that the shadow frame does not contact or overlie the substrate 105. Therefore, the shadow frame 211 is a non-contact shadow frame. For example, in one embodiment a portion (e.g., the portion 213 that overlies the cover frame 205) of the shadow frame 211 is positioned adjacent the perimeter of the substrate 105 at least a distance 217 of 5 mm (preferably 5-10 mm) from the perimeter of the substrate 105. Such a spacing reduces the likelihood of contact between the substrate 105 and the shadow frame 211 that might damage (e.g., chip) the substrate 105. The shadow frame 213 may be positioned a larger or smaller distance from the substrate 105. As shown in FIG. 2B, the cover frame 205 preferably covers at least the surface of a substrate holder 204 between the shadow frame 211 and the substrate 105.

Embodiments of the present invention that include the shadow frame 211, may employ a process recipe similar to or the same as the recipe used by the conventional apparatus 101. Other recipes may be employed. In contrast to the shadow frame 107 of the conventional apparatus 101, because the shadow frame 211 does not contact or overlie the substrate 105, the shadow frame 211 does not significantly disturb process parameters during plasma processing. Therefore, the uniformity of a film deposited on the substrate 105 proximate and/or along an edge region 111 of the substrate 105 is generally increased compared to the uniformity of a film deposited on a substrate using the conventional apparatus 101. Further, the shadow frame 211 does not prevent film deposition onto the edge region 111 of the substrate 105.

Figure 3:
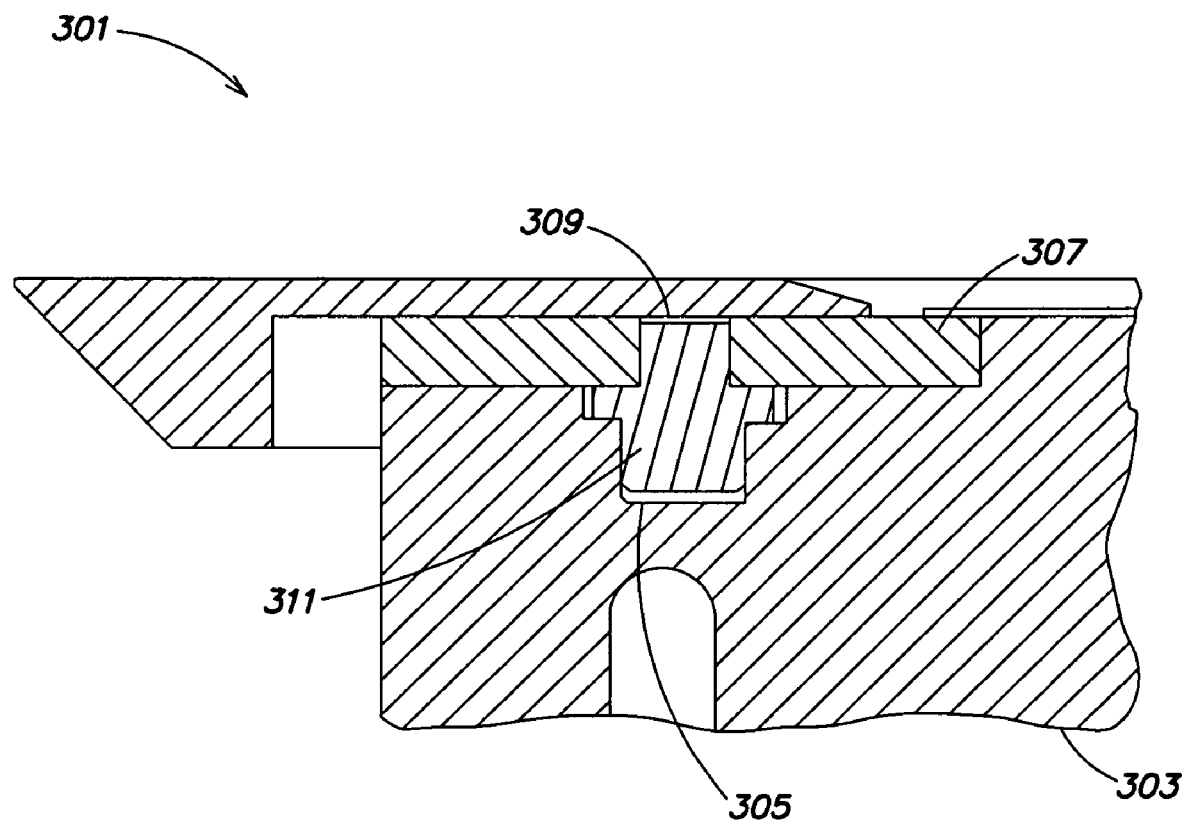
FIG. 3 illustrates a third exemplary apparatus that may be employed during plasma processing in accordance with an embodiment of the present invention.

FIG. 3 illustrates a third exemplary apparatus 301 that may be employed during plasma processing in accordance with an embodiment of the present invention. The third exemplary apparatus 301 is similar to the second exemplary apparatus 210. In contrast to the second exemplary apparatus 210, the substrate holder 303 of the third exemplary apparatus 301 includes one or more grooves or slots 305 (e.g., an oval-shaped slot) along an edge region of the substrate holder 303. For example, the substrate holder 303 may include the one or more grooves or slots 305 proximate a center of each side of the substrate holder 303. Further, the cover frame 307 includes corresponding grooves or slots 309. For example, the cover frame 307 may include one or more grooves or slots 309 proximate a center of each side of the cover frame 307. The third exemplary apparatus 301 may include one or more pins or other kinematic features 311 adapted to couple to a respective groove or slot 305 of the substrate holder 303 and a respective groove or slot 309 of the cover frame 307. In this manner, the movement of the cover frame 307 on the substrate holder 303 (e.g., due to thermal expansion and/or thermal mismatch between various components) is guided and/or limited. In one or more embodiments, the pins 311 may be cylindrical. Pins of other shapes may be employed. Further, slots of different shapes may be employed. In one embodiment four pins 311 may be employed. Other numbers of pins may be used.

Figure 4:
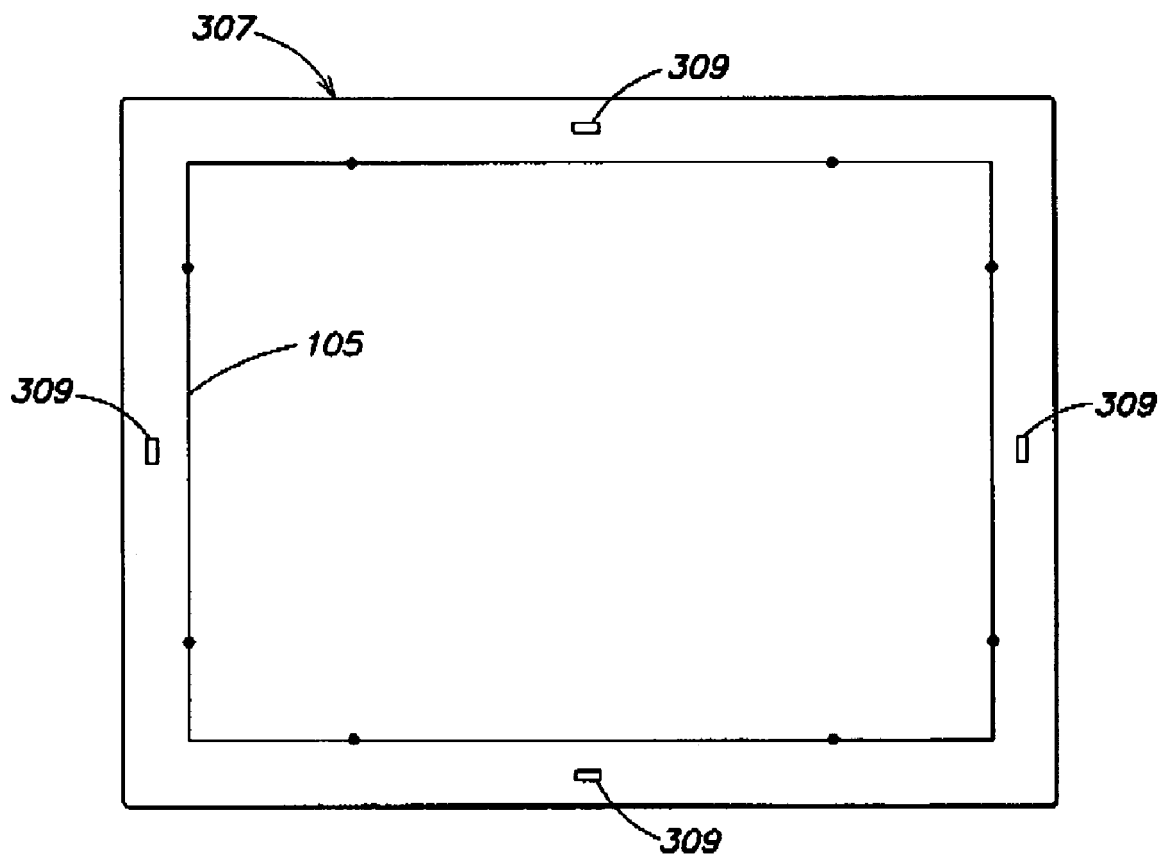
FIG. 4 illustrates a top view of a cover frame included in the third exemplary apparatus of FIG. 3.

FIG. 4 illustrates a top view of a cover frame 307 included in the third exemplary apparatus 301. With reference to FIG.

4, the shape of at least an interior perimeter of the cover frame 307 corresponds to the perimeter of the substrate 105 to which the cover frame 307 is adjacently positioned. Cover frames of different shapes may be employed. The cover frame 307 of FIG. 4 is a single piece cover frame (e.g., formed of anodized aluminum or another suitable material).

Figure 5:
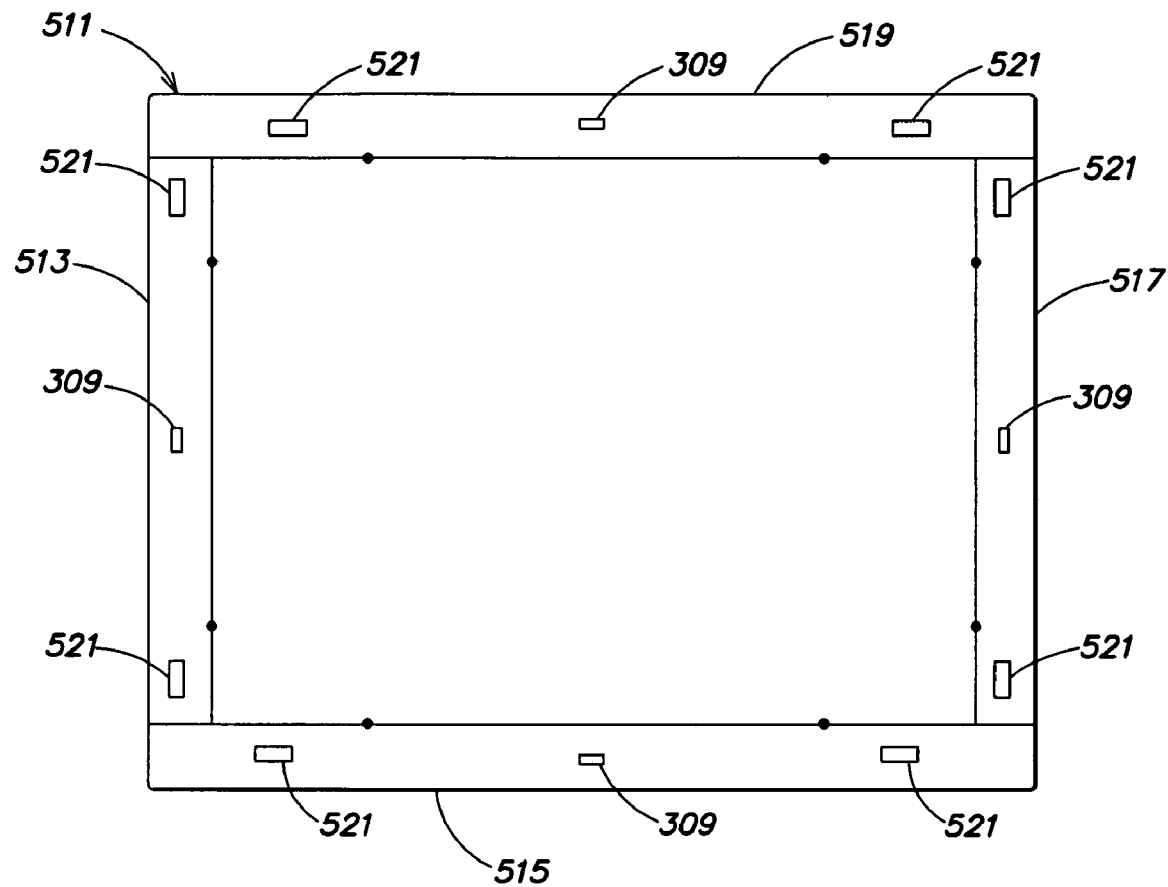
FIG. 5 illustrates a top view of an alternative cover frame which may be included in the third exemplary apparatus of FIG. 3.

FIG. 5 illustrates a top view of an alternative cover frame 511 which may be included in the third exemplary apparatus 301. In contrast to the cover frame 307 of FIG. 4, the alternative cover frame 511 is formed from multiple pieces. For example, the cover frame 511 includes four pieces 513-519 joined together. The cover frame 511 also may include grooves or slots 309 proximate a center of each side of the cover frame 511. Further, the cover frame 511 may include one or more additional grooves or slots 521 in each side of the cover frame 511 (e.g., to provide additional kinematic features that, for example, may reduce rotation of the cover frame 511 when the cover frame 511 is heated). The additional grooves or slots 521 may be a different shape than the grooves or slots 309 proximate the center of each side of the cover frame 511. In at least one embodiment, the cover frame 511 may be formed of a ceramic or similar material.

The foregoing description discloses only exemplary embodiments of the invention. Modifications of the above disclosed apparatus and methods which tall within the scope of the invention will be readily apparent to those of ordinary skill in the art. For instance, in one or more embodiments, an apparatus similar to the second exemplary apparatus 210 but which does not include a cover frame 205 may be employed to perform the present methods. The shadow frame (e.g., non-contact shadow frame) 211 of such embodiments is appropriately modified (e.g., dimensioned) to perform the functions of the cover frame 205 of the second exemplary apparatus 210. During an exemplary method of plasma processing for such embodiments, a substrate is place on a substrate holder of a plasma chamber. The shadow frame is positioned adjacent a perimeter of the substrate such that the shadow frame does not contact or overlie the substrate. Such an arrangement may reduce arcing during plasma processing within the plasma chamber, prevent a surface of the substrate support from contacting a plasma during plasma processing within the plasma chamber, increase film deposition uniformity along an edge region of the substrate, and/or minimize or eliminate edge exclusion.

Further, in embodiments, such as the second exemplary apparatus 210, in which the cover frame 205 does not extend to the perimeter of the substrate holder 204, the cover frame 205 may be adapted to couple to a groove included in the substrate holder. In one or more embodiments the cover frame 205 may be formed from anodized aluminum. An anodized aluminum cover frame may be a one-piece assembly whereas a ceramic cover frame may require a multi-piece assembly joined by appropriate fasteners (e.g., a four-piece assembly joined together by aluminum pins). For at least the above reason, an anodized cover frame may be cheaper to manufacture than a ceramic cover frame, and thermal expansion concerns due to use of multiple components with differing coefficients of thermal expansion may be reduced.

In one exemplary embodiment, use of the present invention may result in a deposited film non-uniformity of less than approximately 10% across a 1 m×1.2 m glass substrate with an 8 mm edge exclusion.

Accordingly, while the present invention has been disclosed in connection with exemplary embodiments thereof, it should be understood that other embodiments may fall within the spirit and scope of the invention, as defined by the following claims.

The invention claimed is:

1. A method for use during plasma processing, comprising:
   placing a substrate horizontally on a substrate holder of a plasma chamber;
   positioning a non-dielectric cover frame in contact with the substrate, at only a lower surface of the substrate, and disposed so as to contact and cover a portion of the substrate holder, wherein the portion of the substrate holder that is covered is disposed both underneath a portion of the substrate contacted by the cover frame and underneath an area laterally adjacent and outside a perimeter of the substrate;
   positioning a shadow frame over a portion of the cover frame not covered by the substrate, wherein the shadow frame is distinct from the cover frame, the shadow frame does not contact the substrate, and the shadow frame is tapered down towards the substrate to form a lip at a lateral gap that exists between the shadow frame and the perimeter of the substrate; and
   performing a plasma process on the substrate while maintaining a neutral electrical potential on the cover frame which is positioned to prevent plasma from contacting the substrate holder which would otherwise be likely to cause arcing.

2. The method of claim 1 wherein performing a plasma process includes employing the shadow frame to prevent a surface of the substrate support from contacting a plasma during plasma processing within the plasma chamber.

3. The method of claim 1 further comprising adjusting during plasma processing at least one of pressure, electrode spacing, RF power and gas flow within the plasma chamber based at least upon use of the shadow frame and cover frame.

4. A method for use during plasma processing, comprising:
   placing a substrate on a substrate holder of a plasma chamber;
   positioning non-dielectric a cover frame in contact with the substrate, at only a lower surface of the substrate, and underneath a perimeter of the substrate, the cover frame having a first end extending from the perimeter of the substrate under the substrate and a second end extending from the perimeter of the substrate out laterally away from the substrate;
   positioning a shadow frame over a portion of the second end of the cover frame and at a distance from the perimeter of the substrate such that the shadow frame does not contact or overlie the substrate, wherein the shadow frame is distinct from the cover frame, and the shadow frame is tapered down towards the substrate to form a lip; and
   employing the cover frame and shadow frame to prevent plasma from contacting the substrate holder during plasma processing within the plasma chamber.

5. The method of claim 4 wherein employing the cover frame and shadow frame includes employing the cover frame and shadow frame to prevent a surface of the substrate support from contacting a plasma while maintaining a neutral or floating electric potential on the cover frame and shadow frame during plasma processing within the plasma chamber.

6. A method for use during plasma processing, comprising:
   placing a substrate on a substrate holder of a plasma chamber;
   positioning a non-dielectric cover frame in contact with the substrate, at only a lower surface of the substrate, and underneath a perimeter of the substrate;
   positioning a shadow frame over the cover frame and at a distance from the perimeter of the substrate such that the shadow frame does not contact or overlie the substrate, wherein the shadow frame is distinct from the cover frame, and the shadow frame is tapered down towards the substrate to form a lip; and employing the shadow frame to prevent plasma from contacting the substrate holder during plasma processing within the plasma chamber.

7. The method of claim 6 wherein employing the shadow frame includes employing the shadow frame to prevent a surface of the substrate support from contacting a plasma while maintaining a neutral or floating electric potential on the shadow frame during plasma processing within the plasma chamber.

* * * * *